US008588267B1

(12) United States Patent
Panak

(10) Patent No.: US 8,588,267 B1
(45) Date of Patent: Nov. 19, 2013

(54) RECTANGULAR CORE OPTICAL FIBER AND RECTANGULAR CORE OPTICAL FIBER ARRAYS

(75) Inventor: David L. Panak, Rockwall, TX (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 13/557,169

(22) Filed: Jul. 24, 2012

(51) Int. Cl.
*H01S 3/09* (2006.01)

(52) U.S. Cl.
USPC ............. 372/69; 372/70; 372/75; 372/6

(58) Field of Classification Search
USPC ............................. 372/69, 70, 75, 6
See application file for complete search history.

(56) References Cited

U.S. PATENT DOCUMENTS

| 2005/0281508 A1* | 12/2005 | Krupkin et al. | 385/36 |
| 2006/0002435 A1* | 1/2006 | Kim | 372/6 |
| 2010/0189137 A1* | 7/2010 | Shkunov et al. | 372/6 |
| 2010/0253769 A1* | 10/2010 | Coppeta et al. | 348/58 |
| 2010/0290750 A1* | 11/2010 | Imamura | 385/126 |

* cited by examiner

*Primary Examiner* — Kinam Park
(74) *Attorney, Agent, or Firm* — McDermott Will & Emery LLP

(57) ABSTRACT

An array of optical fibers includes a plurality of optical fibers. Each optical fiber includes a core having a substantially rectangular cross section, and cladding surrounding the core. The cladding includes a pair of substantially parallel flats. The array of optical fibers can be used in combination with a plurality of laser diodes to provide a laser pump whereby an input end of each optical fiber is optically coupled to the output of a respective one of the plurality of laser diodes, and where the output ends of the optical fibers are arranged in an array.

20 Claims, 3 Drawing Sheets

RECTANGULAR CORE OPTICAL FIBER AND RECTANGULAR CORE OPTICAL FIBER ARRAYS

FIELD OF THE INVENTION

The present invention relates generally to laser diodes used as pumps for coherent high power lasers, and more particularly to rectangular core fiber arrays for a laser diode pumping system.

BACKGROUND

Laser diodes are mass produced through manufacturing processes similar to those used for building silicon wafer based integrated circuits. These laser diodes have high electrical to optical conversion efficiency and high brightness (referring to the combined angular and spatial concentration of light emitted from the source). Though the light emitted from multiple laser diodes is not coherent (in phase with each other), large numbers of laser diodes can be grouped together to 'pump' or illuminate a 'gain' medium (a glass slab or optical fiber that has been impregnated with a rare-earth element) such that a coherent 'seed' laser source passing through the gain medium will be amplified and still remain coherent. In this way, the incoherent optical energy of laser diodes can be converted into a coherent and highly energetic laser source that is then useful for any manner of medical, scientific, and industrial purpose.

The light emitting area or stripe of a typical high power multimode laser diode is very small, on the order of 1 um in height by 95-190 μm in stripe width. The 1 μm height is set by the guiding layers that form the semiconductor junction of the laser diode, and the width is set somewhat by the desired output power. For example, laser diodes in the 980 nm class of emitting wavelength are produced with approximately 85 mW of output power per μm of emitter width, meaning that a typical 95 μm wide emitter would have a rated output power of 8 W. With reference to FIG. 1, the emitter divergence of a laser diode of this type would be on the order of 10 degrees (full width angle) in the parallel axis direction ($\theta_{\|}$, in FIG. 1) and 40 degrees (full width angle) in the perpendicular axis ($\theta_{\perp}$, in FIG. 1). Emitter size and angular divergence can be multiplied together to form a specification called 'etendue', whereby the brightness of a laser diode is then its etendue divided by its output power. Brightness for a laser diode can be improved by increasing the output power for a given emitter size and divergence angle, or by reducing the divergence angles or emitter size (reducing etendue) for a given output power.

For the laser diode shown in FIG. 1 with emitting area A, the etendue is given by:

$$\text{etendue}_{LD} = A \cdot \theta_{\perp} \cdot \theta_{\nu}$$

and the brightness, B, of the laser diode is simply the output power P (in Watts) divided by the etendue (in units of cm² sr, where sr is for steradian, the solid angle):

$$B_{LD} = \frac{P}{\text{etendue}_{LD}}$$

It is generally advantageous for high power laser amplifiers to have their incoherent pumping sources (groups of laser diodes) illuminate their gain medium with the highest possible brightness. The high brightness of the pump source allows a coherent seed laser to efficiently extract the available pump energy from the gain medium for maximum amplification while retaining good coherent beam quality (the ability to focus to a small spot).

Typically, pump energy from laser diodes is delivered to the gain medium via a multimode (large etendue) optical fiber. The highest brightness of a pump source is generally achieved when the pump output fiber has the smallest etendue possible for the greatest amount of contained optical power. Contemporary pump sources are generally built in one of two types. In a first type, commonly referred to as a Fiber Coupled Single Emitter Device or FCSED, individual laser diodes are coupled one-to-one into small etendue multimode optical fibers within hermetic packaging. Those fibers are then bundled together and spliced to a single, larger etendue multimode fiber. In a second type, commonly referred to as a Fiber Coupled Multi Emitter Device or FCMED, the output of multiple laser diodes is combined through complex bulk lensing systems onto the input face of a multimode fiber.

SUMMARY

In some aspects, an array of optical fibers includes a plurality of optical fibers. Each optical fiber includes a core having a substantially rectangular cross section, and cladding surrounding the core. The cladding includes a pair of substantially parallel flats.

At least a portion of at least one flat of each optical fiber can be in substantial mating engagement with at least a portion of a flat of another optical fiber. At least a portion of the at least one flat of each optical fiber that can be in substantial mating engagement with at least a portion of the flat of another optical fiber can further be at an output end of each optical fiber. The array of optical fibers can further include a plurality of laser diodes, and each laser diode can be optically coupled to a respective one of the plurality of optical fibers at an input end of each optical fiber. The substantially rectangular cross section of each optical fiber includes a long axis, and the substantially parallel flats can be substantially parallel to the long axis of the rectangular cross section Each optical fiber further can include a protective coating surrounding at least a portion of the cladding. The protective coating can be removed from each optical fiber where at least a portion of the at least one flat is in substantial mating engagement with at least a portion of the flat of the other optical fiber. An input end of each optical fiber can define a lens, and a center of curvature of each lens can be substantially aligned with a geometric center of a respective core. The input end of each optical fiber can be substantially wedge-shaped. The cladding can also be substantially double-D shaped and can include curved portions extending between the pair of substantially parallel flats. Each optical fiber can also include a fiber Bragg grating imprinted thereon.

In other aspects, a laser pump includes a plurality of laser diodes each providing an output, and a plurality of optical fibers. Each optical fiber includes a core having a substantially rectangular cross section, and cladding surrounding the core. The cladding of each optical fiber includes a pair of substantially parallel flats. An input end of each optical fiber is optically coupled to the output of a respective one of the plurality of laser diodes, and at least the output ends of the optical fibers are arranged in an array.

In some embodiments, adjacent the output end of each optical fiber at least a portion of at least one of the substantially parallel flats can be in substantial mating engagement with at least a portion of a flat of another optical fiber. For each optical fiber the substantially rectangular cross section includes a long axis, and the substantially parallel flats can be substantially parallel to the long axis. The core of each optical fiber can define a lens at the input end, and the input end of each optical fiber can be substantially wedge shaped. Each optical fiber can also include a fiber Bragg grating imprinted thereon.

In other aspects, method for making a laser pump includes forming a pair of substantially parallel flats on an output end of each optical fiber in a plurality of optical fibers. Each optical fiber includes a substantially rectangular cross section core and cladding surrounding the core. The pair of substantially parallel flats are formed on the cladding. A lens is formed on an input end of each optical fiber, which includes forming the input end of the optical fiber into a substantial wedge shape. The input end of each optical fiber is optically coupled to a respective one of a plurality of laser diodes, and the output ends of the plurality of optical fibers are arranged into an array.

Arranging the output ends into an array can include positioning at least a portion of at least one of the substantially parallel flats of each optical fiber in substantial mating engagement with at least a portion of a flat of another optical fiber. Forming the pair of substantially parallel flats can include polishing the cladding to reduce a thickness of the cladding in a direction substantially perpendicular to a long axis of the substantially rectangular cross section core.

It is to be understood that both the foregoing general description and the following detailed description are exemplary and explanatory and are intended to provide further explanation of the invention as claimed.

In the following detailed description, numerous specific details are set forth to provide a full understanding of the subject technology. It will be apparent, however, to one ordinarily skilled in the art that the subject technology may be practiced without some of these specific details. In other instances, well-known structures and techniques have not been shown in detail so as not to obscure the subject technology.

DETAILED DESCRIPTION

A system of various laser optical components and manufacturing techniques is provided to produce a low cost, high reliability pump laser system that is scalable to very high powers.

Figure 1:
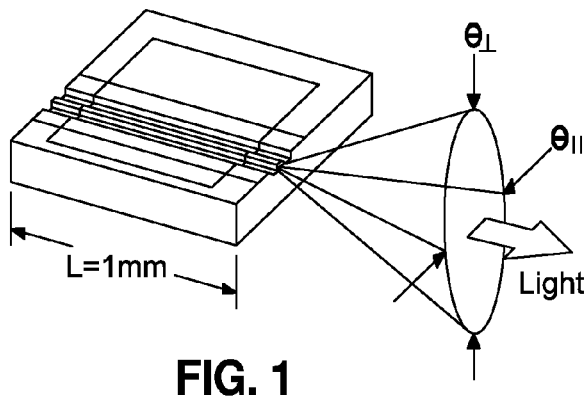
FIG. 1 is a perspective view of a laser diode.
Figure 2:
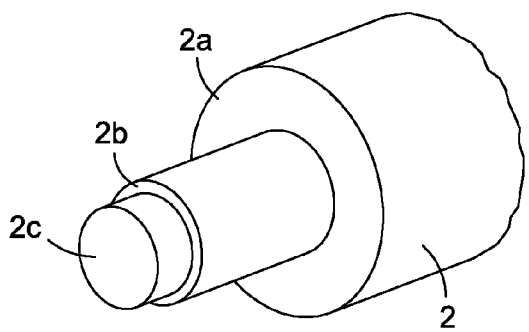
FIG. 2 is a perspective view with portions cut away to show the internal structure of a round core/round clad optical fiber.

A sectioned end-view of a typical round core/round clad multimode fiber 2 is shown in FIG. 2. These types of fibers typically include three parts. Part 2a is the fiber coating which is typically applied to the drawn fiber as a protective layer by the fiber manufacturer. The coating may be acrylate, polyimide, or any other suitable material. The fiber cladding 2b is a transparent material, usually silica, and typically doped (impregnated) with materials that can be used to modify the refractive index of the material, such as fluorine, germanium, and phosphorus. The fiber core 2c is also a transparent material, usually silica, and also doped with materials used to modify the refractive index. To provide the index guiding property of the fiber for total internal reflection of light coupled into the core, the refractive index of the fiber core material ($n_1$) is slightly greater than the refractive index of the cladding material ($n_2$). The materials and proportions of dopants are chosen during the construction of the glass billet, or preform, from which the fiber is drawn. In the drawing process, the preform is melted until a fiber of glass can be pulled from it, such that the preform experiences a 'geometric drawdown' whereby the relative dimensions of the resultant fiber remain the same as the relative dimensions of the much larger preform. The geometric drawdown occurs as a result of the surface tension properties of molten glass and mass conservation. The optical fiber can be expected to maintain the relative dimensions and shapes resulting from the drawdown process.

The difference in refractive index among the materials found in optical fibers of the type shown in FIG. 2, which are classified as step-index multimode, defines the light guiding property of the fiber. Light that is coupled into the fiber with a cone-angle less than the angle for total-internal-reflection will be guided along the core of the fiber. The acceptance cone-angle, $\theta_{max}$, for a multimode optical fiber is defined as the following:

$$\theta_{max} = \sin^{-1}(NA)$$

where NA is the numerical aperture of the fiber in radians. The NA of a multimode step index fiber is defined by the index of refraction properties for the core ($n_1$) and cladding ($n_2$) materials according to the equation:

$$NA = \sqrt{n_1^2 - n_2^2}$$

The etendue for a round core fiber describes the available mode area (light coupling or gathering ability) for a given fiber core diameter, d, and numerical aperture, NA, and is usually denoted with the units of $cm^2$ sr:

$$etendue_{round\ fiber} = \frac{\pi^2 d^2}{4} NA^2 = A \cdot \pi NA^2 = A \cdot \Omega$$

where A is the cross section area of the fiber core in $cm^2$ and $\Omega$ is the solid angle of the light acceptance cone in steradians. The Brightness for light exiting a fully filled fiber is then a function of the total average power, P, (in Watts) and the etendue:

$$B = \frac{P}{etendue_{fiber}}$$

For the commercial laser diode described previously with emitting area of 95 μm wide by 1 Ξm tall and divergence angles ($\theta_\parallel$ and $\theta_\perp$) of 40 degrees and 10 degrees respectfully, the etendue$_{LD}$ is 0.0095 cm×0.0001 cm×0.70 rad×0.175 rad=$1.16\times10^{-7}$ cm$^2$ sr. Thus, for an emitter power of 8 W, the Brightness of the laser diode is 69 MW/cm$^2$ sr.

A typical round core multimode optical fiber (105 μm core diameter, NA=0.12) coupled to such a laser diode in a commercial FCSED will have an etendue of about $3.9\times10^{-6}$ cm$^2$ sr. This means that commercial FCSEDs with round core fibers will typically have only about 3% of their available fiber mode space initially 'filled' (the etendue of the fiber is 33 times the etendue of the laser diode), such that after propagation through a short length of fiber, the light scatters and spreads to fill the remaining mode space of the fiber and results in a roughly 97% loss of laser diode source brightness. Assuming negligible attenuation in the pump fiber for the same 8 W laser diode and assuming further that the fiber is fully filled, the output fiber Brightness would be only about 2.0 MW/cm$^2$ sr.

FCSEDs have a manufacturing advantage over FCMEDs in that vendors have developed automated processes to place laser diode chips into housings, align optical fibers to the laser diode chip outputs, connect the diodes to the electrical supply leads, and hermetically seal and test the completed devices. For lowest cost, FCSEDs typically do not use bulk optics for coupling light from the laser diode into the fiber, rather the fiber itself has a coupling lens machined into its face and it is positioned very close to the laser diode emitter surface. FCSEDs are built in high production volumes, and are commonly used as pump sources (through the use of an optical pump combiner) for optical fiber amplifiers in telecommunications and industrial cutting lasers. As mentioned above, however, FCSEDs lose a significant amount of their available brightness in coupling to standard round core optical fibers (~3% fill factor of light into the mode space of the FCSED fiber).

FCMEDs typically have a brightness advantage over FCSEDs for high power applications, in that the optical energy of multiple emitters can be imaged in a very dense fashion onto the input face of the pump output fiber (~80% fill factor of light into the multimode pump output fiber). However, FCMED systems often use a pair of bulk optics (lenses) for each emitter that must be held in careful alignment to keep the light from the multiple emitters focused onto their respective and overlapping regions on the input face of the pump output multimode fiber. The complex array of internal optical elements and complicated assembly processes drive up the cost, size, and mass of FCMEDs on a per bright-watt basis. Since the laser diodes in FCMEDs are not individually hermetically sealed, they are susceptible to cross contamination and 'fratricide' and are therefore generally less reliable than FCSEDs. As a result, FCMEDs do not have as large an installed industrial base as FCSEDs.

Figure 3:
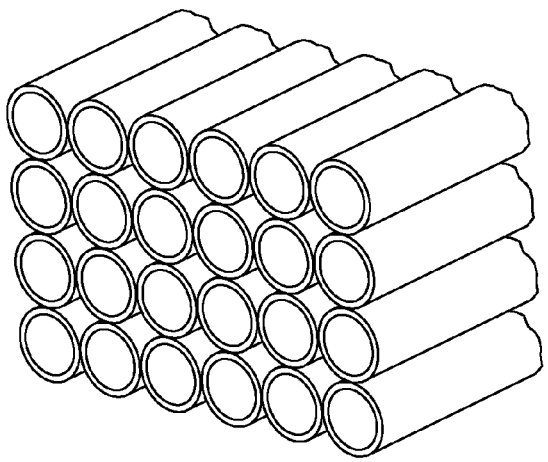
FIG. 3 is a perspective view of an array of round core/round clad optical fibers.

The output fibers of FCSEDs are often grouped together into a bundled array or into fused tapered fiber combiners. The bundled arrays can be used for pumping gain blocks, and the fiber combiners can be used for pumping double-clad fiber amplifiers. FIG. 3 shows an array of round core/round clad fibers bundled together. For a typical FCSED multimode pump fiber with a core diameter of 105 μm and cladding diameter of 125 μm, the relatively low packing density of stacked fibers in a high power array causes an additional loss in source diode brightness. Assuming that the mode space of the fibers has been 'filled out' over the propagation distance within the fiber from the source laser diode to the fiber exit, the additional loss of brightness for an array is the ratio of the total cross sectional area of the array relative to the total core area of the array. For the particular array of 24 fibers shown in FIG. 3, the array cross sectional area is $3.75\times10^{-3}$ cm$^2$, and the total core area is $2.08\times10^{-3}$ cm$^2$, yielding a loss in brightness of 44% due to the packing density of the stacked fibers. Where, in the given example, the individual laser diode brightness was 69 MW/cm$^2$ sr, and the individual fiber brightness (fully filled) was 2.0 MW/cm$^2$ sr, the array brightness is now only 1.12 MW/cm$^2$ sr. By comparison, commercial FCMED vendors using arrays of bulk coupling optics to image and polarization combine the output of multiple emitters onto the face of a single fiber have achieved values of about 5 MW/cm$^2$ sr and higher for pump fiber brightness.

High power laser amplification applications often include a feedback interference grating within the pump source for wavelength locking, which stabilizes the output of the laser diodes together to a chosen gain absorption wavelength over a wide operating temperature range. FCMEDs have an additional advantage over FCSEDs in that they already incorporate the parallel or collimated beam space between the sets of fiber coupling optics that would be necessary for the effectiveness of a wavelength locker such as a volume Bragg grating (VBG). Lower power FCSEDs with single mode or low etendue multimode fiber outputs can make use of fiber Bragg gratings (FBGs) imprinted directly into their output fibers for stabilizing and locking their output wavelength. For high power FCSEDs with large etendue multimode fiber that cannot obtain stable wavelength locking feedback from FBGs (due to the huge mode mismatch between the laser diode and the fiber), the low cost fiber face lensing described previously does not provide a parallel light region for effective implementation of an interference grating. Instead, wavelength locked high power FCSEDs often use a VBG in a parallel beam space fashioned through bulk coupling optics in a similar manner as the FCMED.

Figure 4:
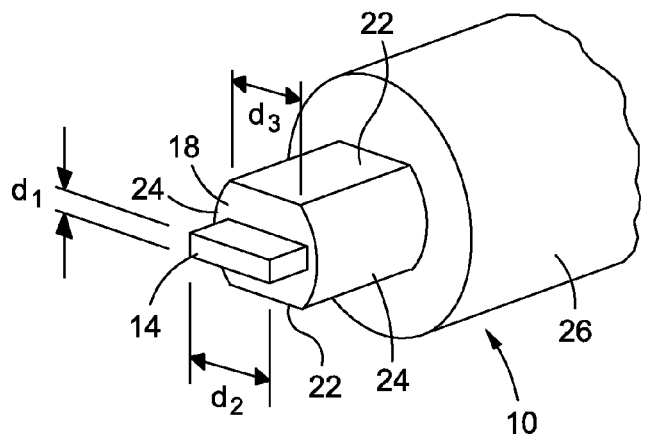
FIG. 4 is a perspective view with portions cut away to show the internal structure of a rectangular core optical fiber with cladding having flats formed thereon in accordance with some aspects of the present invention.

FIG. 4 illustrates a multimode optical fiber 10 including a core 14 comprising one or more core fibers and having a substantially rectangular cross section with dimensions $d_1\times d_2$, and a substantially flattened or 'double-D' shaped cladding 18. The cladding 18 has a lower index of refraction than the core 14. Compared to traditional multimode optical fibers often used for industrial FCSEDs and having round fiber cores, the rectangular core 14 of the optical fiber 10 has a much smaller etendue that more closely matches the etendue of a typical laser diode. As a result, the optical fiber 10 can better maintain the brightness of the laser diode. For example, for the same acceptance cone angle, width, and laser diode coupling efficiency, the rectangular core 14 will have a lower etendue than a round core. The etendue for a rectangular core optical fiber with core dimensions $d_1\times d_2$ is given by:

$$etendue_{rc\text{-}fiber}=d_1\cdot d_2\cdot(2NA)^2=A\cdot 4NA^2$$

In addition to the substantially rectangular shape of the core 14, which helps to maintain source brightness, the cladding 18 of the fiber 10 can include a substantially flattened or 'double-D' shape to assist in handling and manufacturing of the fiber 10 and arrays of fibers 10. In this regard, a pair of substantially parallel flats 22 having a length $d_3$ can be formed on the cladding 18 and can be substantially aligned with the long axis ($d_2$) of the substantially rectangular cross section of the core 14. In the illustrated embodiment, convex curved portions 24 extend between the pair of substantially parallel flats 22 in the direction of the short axis ($d_1$) of the core 14, although other configurations, such as another pair of straight, substantially parallel flats could also be used. In some embodiments, the flats 22 are aligned within approximately +/−0.5 degrees of the long axis of the core 14. By aligning the flats 22 of the cladding 18 with the long axis of the core 14, tooling used to grip the outer surface of the cladding 18 during various alignment and manufacturing operations can be mechanically referenced to aid in proper alignment of the long axis of the core 14. The fiber 10 also includes a coating 26 that covers and protects the cladding 18.

By way of example only, for a given rectangular core 14 like that shown in FIG. 4 with dimensions $d_1=22$ μm, $d_2=120$ μm and NA=0.12, the etendue is $1.5 \times 10^{-6}$ cm$^2$ sr. This etendue is approximately 10 times larger than the etendue of the laser diode, which improves coupling efficiency for an FCSED package, but is only about 38% of the etendue of a similarly-sized round core fiber. This corresponding reduction in etendue for the same power and size of laser diode results in a brightness for the pump fiber exit of about 5.3 MW/cm$^2$ sr, an improvement for the FCSED output fiber of almost 300%.

Figure 5:
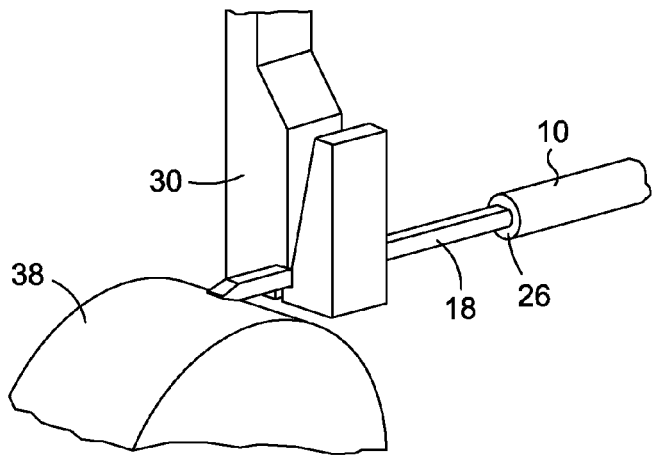
FIG. 5 is a perspective showing one embodiment of a lensing operation for rectangular core optical fibers in accordance with some aspects of the present invention.
Figure 6:
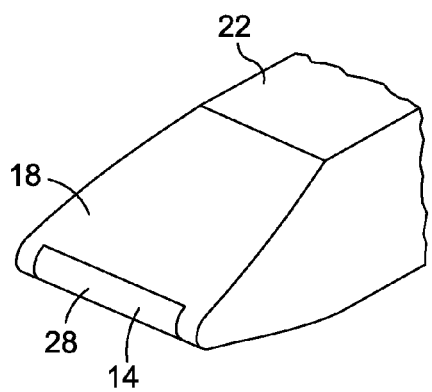
FIG. 6 is an enlarged perspective view of an end of a rectangular core optical fiber after performing a lensing operation in accordance with some aspects of the present invention.

Referring also to FIGS. 5 and 6, for optical coupling to laser diodes, the rectangular core fiber 10 may undergo a manufacturing process that machines a coupling lens 28 into an input end of the fiber 10 such that the machined coupling lens 28 is substantially parallel to the long axis of the core 14. For example, in some embodiments, the lens 28 is parallel with the long axis of the core to within about 2 degrees. The flats 22 provided on the cladding 18 can advantageously be used to provide proper rotational alignment of the core 14 during machining processes. For example, fiber grippers on the machine tools can rely on the flats 22 as a mechanical reference for determining the orientation of the long axis ($d_2$) of the core 14. This can reduce or eliminate the need to rely upon the more complicated process of using back illumination of the fiber to establish proper rotational alignment of the fiber before the lens machining operation.

In the exemplary lensing operation of FIG. 5, a piece of the optical fiber 10 having the 'double-D' shaped cladding 18 and rectangular core 14 has had the coating 26 stripped back and is held in place by a fiber gripper 30. The gripper 30 has reference flats that mechanically align to the flats 22 of the cladding 18. The gripper 30 holds the fiber 10 and manipulates the fiber 10 with respect to a high speed and/or ultrasonic grinding wheel 34 to form the lens 28 in the input end of the core 14. More specifically, the fiber 10 can be moved by the gripper 30 in a controlled manner to fashion the input end of the fiber 10 into substantially a wedge shape, while also forming a relatively small radius of curvature (for example about 5-20 um) on the material at the tip of the core 14 to define a generally cylindrical lens. Of course, the tip can be cut into any desired lens shape as required by a particular application using grinding, abrasive blasting, laser ablation, or any other technique sufficient to remove the material of the core 14 in a controlled fashion. Because the gripper 30 is mechanically aligned with the flats 22 of the cladding 18, and because the flats 22 of the cladding 18 are generally aligned with the long axis of the core 14, the long axis of the resulting lens 28 can be accurately aligned to the long axis of the core 14, and the center of curvature of the lens 28 can also be aligned to the geometric center of the core 14.

Figure 7:
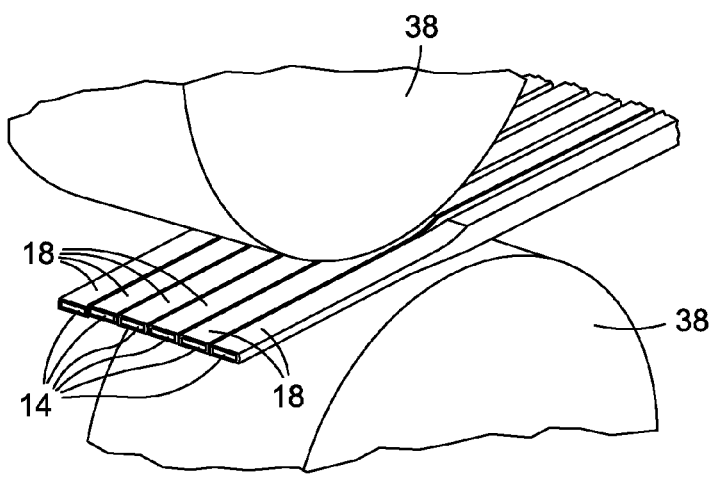
FIG. 7 is a perspective view showing a clad polishing operation being performed on a row of rectangular core optical fibers in accordance with some aspects of the present invention.

Referring also to FIG. 7, several fibers 10 can be simultaneously "gang polished" as an assembly to reduce the cladding thickness. Whether performed simultaneously on several fibers 10 or individually, reduction of the cladding thickness generally is performed on an output end of the fibers 10 so the fibers 10 can be arranged into an array, as discussed further below. However, in some embodiments, the cladding thickness can also be reduced on the input end of the fibers 10 or on an intermediate portion of the fibers, depending upon the particular application. In the illustrated example, a row of six fibers 10 are gang polished in a cladding reduction operation. The fibers 10 are aligned into a row using the flats 22 on the cladding 18, which can be exposed by stripping back the coating 26. Two opposed polishing wheels 38 can then be used together to grind down the cladding 18 on each side of the fibers 10. Alternatively, a single polishing wheel 38 can be used to first grind down the cladding 18 on one side of the fibers 10, and then the fibers 10 can be flipped to grind down the cladding 18 on the other side of the fibers 10. Substantially any process such as grinding, abrasive blasting, laser ablation, or other techniques can be used to reduce the thickness of the cladding 18. In some embodiments, such grinding and polishing operations can reduced the cladding thickness to approximately 10 μm, which is similar to the cladding thickness for standard round core fibers.

Reducing the cladding thickness generally does not change the total-internal-reflection nature of the fiber, which is dependent upon the index of refraction difference between the materials used for the core 14 and the cladding 18 of the fiber 10, and not on the thickness of the cladding 18. However, a clad polishing operation can locally reduce the tensile strength of the fiber, which is why it can be beneficial to protect the clad polished fiber and hold it straight along the polished region using, for example, mounting glass that has been provided with suitable V-grooves for supporting the fibers 10. After the fibers 10 have been polished to reduce the cladding thickness, they can be stacked and arranged in the v-grooved mounting glass for additional operations, such as tip polishing and the application of an anti-reflection coating.

Figure 8:
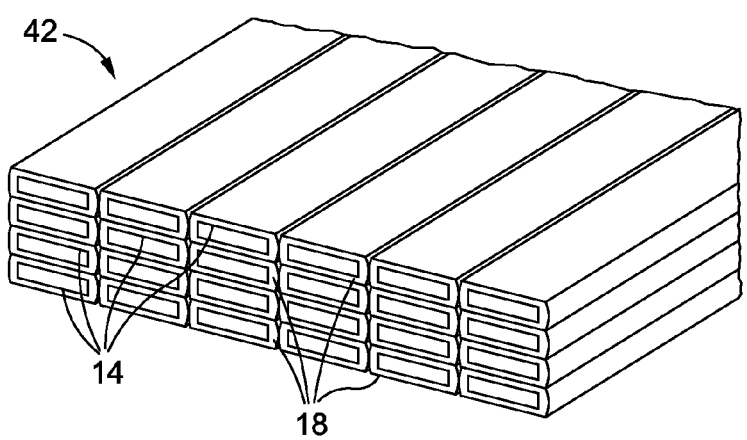
FIG. 8 is a perspective view of an array of rectangular core fibers in accordance with some aspects of the present invention.

Referring also to FIG. 8, multiple rows of clad polished fibers 10 can be stacked together in an array 42. The generally rectangular shape of the clad polished fibers 10 allows at least one flat 22 of each fiber 10 to substantially matingly engage the flat 22 of another fiber 10 in the array 42. In some embodiments, the flats 22 formed in the cladding 18 can be in direct physical contact with one another. In other embodiments a thin membrane or a layer of bonding material may be located between the fibers 10 to prevent direct physical contact between the cladding 18 and/or to bond the individual fibers 10 to one another. Although the illustrated embodiment of FIG. 8 shows the fibers 10 arranged in regularly spaced rows and columns, in other embodiments the fibers of each row may be staggered or offset with respect to the fibers of another row. Moreover, some fibers 10 can be oriented at 90 degrees relative to other fibers 10 such that the flats 22 of some fibers are in engagement with the curved portions 24 (or what's left of the curved portions 24 after polishing) of certain other fibers.

The generally rectangular shape of the core 14 and the polished cladding 18 results in an overall packing density for the resulting array 42 that is generally higher than the packing density for an array of similarly-sized round core fibers. By way of example only, for an array of fibers arranged as in FIG. 8 and including an overall array cross section area of $1.4 \times 10^{-3}$ cm$^2$, the total core area of the array is $6.33 \times 10^{-4}$, which represents a 54% loss in brightness for the array as compared to the brightness of an individual fiber. However, for the same power per fiber, the array of FIG. 8 is much smaller and more densely packed than an array of similarly-sized circular core fibers, such as the array shown in FIG. 3, which results in a brightness of about 3.0 MW/cm² sr, or almost three times brighter than the circular core fiber array. Once the fibers 10 are arranged in an array, a protective coating (not shown) similar to the coating 26 can be installed around the entire array to protect the fibers 10 of the array and maintain the relative positions of the fibers 10 of the array.

As explained in the background section on pump wavelengths and fiber Bragg gratings (FBGs), when multiple laser diodes are used together in a system to pump a laser amplifier, it is often advantageous for the individual laser diodes to remain locked to the best absorption wavelength of the gain medium. The rectangular core fiber 10 has the additional performance benefit of providing a relatively lower mode volume (again, compared to a round core fiber) that is more accepting to the imprint of a grating. For a grating printed on a rectangular core fiber, the number of filled fiber modes providing feedback is significantly reduced as compared to a grating imprinted on a circular core fiber. With fewer feedback modes, the feedback signal becomes more stable, and the laser diodes can more effectively remain locked to the feedback provided by the imprinted grating. When all the fibers used in an array are imprinted with FBGs that have the substantially same spacing, then all the corresponding laser diodes in the array will operate at approximately the same wavelength.

Figure 9:
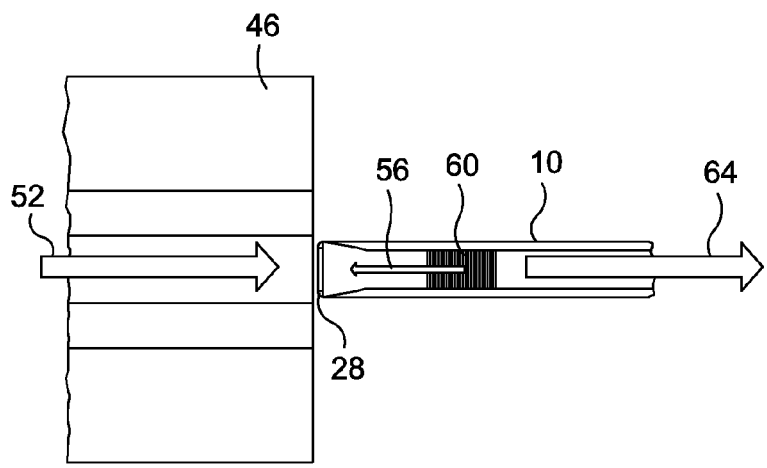
FIG. 9 is a top schematic view of a laser diode optically coupled to a rectangular core optical fiber that includes a fiber Bragg grating in accordance with some aspects of the present invention.

With reference to FIG. 9, a laser diode 46 is coupled to a rectangular core fiber 10. The laser emission 52 is coupled into the core 14 of the fiber 10 through the lens 28 that is fashioned onto the tip of the fiber 10. As the light propagates down the fiber 10, a small fraction 56 is reflected back into the laser diode 46 by the fiber Bragg grating (FBG) 60. This reflected light interferes with the resonance cavity of the laser diode 46, causing it to resonate at a wavelength that closely matches the transmissivity of the FBG 60, thereby reducing the feedback to a minimum. The remaining laser light 64 propagating along the fiber 10 is thus held substantially stable to a fixed wavelength by the FBG 60. The feedback provided by the fiber Bragg grating in the rectangular core fiber 10 is more stable than the feedback provided by a similar round core fiber due to the lower mode number of the rectangular core fiber 10, which results in a more confined and consistent feedback signal for the laser diode 46.

To provide a laser pump using the rectangular core fibers 10, a plurality of laser diodes 46 are optically coupled to the input ends of a plurality of rectangular core fibers 10, each generally in the manner shown in FIG. 9. Because the laser diodes 46 are generally larger than the fibers 10, the input ends of the fibers 10 will tend to be somewhat spaced apart from one another. To alleviate this the fibers 10 can be bundled together and routed as needed toward the gain medium that is to be pumped. The output ends of the fibers 10 are arranged into an array generally in the manner shown in FIG. 8, although other arrangements are possible depending on the particular application. The output ends of the fibers 10 can then be positioned to illuminate the gain medium.

The foregoing description is provided to enable a person skilled in the art to practice the various configurations described herein. While the subject technology has been particularly described with reference to the various figures and configurations, it should be understood that these are for illustration purposes only and should not be taken as limiting the scope of the subject technology.

There may be many other ways to implement the subject technology. Various functions and elements described herein may be partitioned differently from those shown without departing from the scope of the subject technology. Various modifications to these configurations will be readily apparent to those skilled in the art, and generic principles defined herein may be applied to other configurations. Thus, many changes and modifications may be made to the subject technology, by one having ordinary skill in the art, without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

The invention claimed is:

1. An array of optical fibers, the array comprising:
    a plurality of optical fibers, each optical fiber including a core having a substantially rectangular cross section, and cladding surrounding the core, the cladding including a pair of substantially parallel flats.

2. The array of optical fibers of claim 1, wherein at least a portion of at least one flat of each optical fiber is in substantial mating engagement with at least a portion of a flat of another optical fiber.

3. The array of optical fibers of claim 2, wherein the at least a portion of the at least one flat of each optical fiber that is in substantial mating engagement with at least a portion of the flat of another optical fiber is at an output end of each optical fiber, the array of optical fibers further comprising a plurality of laser diodes, each laser diode optically coupled to a respective one of the plurality of optical fibers at an input end of each optical fiber.

4. The array of optical fibers of claim 1, wherein for each optical fiber the substantially rectangular cross section includes a long axis, and wherein the substantially parallel flats are substantially parallel to the long axis of the rectangular cross section.

5. The array of optical fibers of claim 1, wherein each optical fiber further includes a protective coating surrounding at least a portion of the cladding.

6. The array of optical fibers of claim 5, wherein the protective coating is removed from each optical fiber where the at least a portion of the at least one flat is in substantial mating engagement with the at least a portion of the flat of the other optical fiber.

7. The array of optical fibers of claim 1, wherein an input end of each optical fiber defines a lens.

8. The array of optical fibers of claim 7, wherein a center of curvature of each lens is substantially aligned with a geometric center of a respective core.

9. The array of optical fibers of claim 7, wherein the input end of each optical fiber is substantially wedge-shaped.

10. The array of optical fibers of claim 1, wherein the cladding is substantially double-D shaped and includes curved portions extending between the pair of substantially parallel flats.

11. The array of optical fibers of claim 1, wherein each optical fiber further includes a fiber Bragg grating imprinted thereon.

12. A laser pump comprising:
- a plurality of laser diodes, each laser diode providing an output; and,
- a plurality of optical fibers, each optical fiber including:
  - a core having a substantially rectangular cross section;
  - cladding surrounding the core, the cladding of each optical fiber including a pair of substantially parallel flats;
  - an input end optically coupled to the output of a respective one of the plurality of laser diodes; and,
  - an output end;
  - wherein at least the output ends of the optical fibers are arranged in an array.

13. The laser pump of claim 12, wherein adjacent the output end of each optical fiber at least a portion of at least one of the substantially parallel flats is in substantial mating engagement with at least a portion of a flat of another optical fiber.

14. The laser pump of claim 12, wherein for each optical fiber the substantially rectangular cross section includes a long axis, and wherein the substantially parallel flats are substantially parallel to the long axis.

15. The laser pump of claim 12, wherein the core of each optical fiber defines a lens at the input end.

16. The laser pump of claim 12, wherein the input end of each optical fiber is substantially wedge shaped.

17. The laser pump of claim 12, wherein each optical fiber further includes a fiber Bragg grating imprinted thereon.

18. A method for making a laser pump, the method comprising:
- forming a pair of substantially parallel flats on an output end of each optical fiber in a plurality of optical fibers, each optical fiber having a substantially rectangular cross section core and cladding surrounding the core, the pair of substantially parallel flats being formed on the cladding;
- forming a lens on an input end of each optical fiber, including forming the input end into a substantial wedge shape;
- optically coupling the input end of each optical fiber to a respective one of a plurality of laser diodes; and,
- arranging the output ends of the plurality of optical fibers into an array.

19. The method of claim 18, wherein arranging the output ends into an array includes positioning at least a portion of at least one of the substantially parallel flats of each optical fiber in substantial mating engagement with at least a portion of a flat of another optical fiber.

20. The method of claim 18, wherein forming the pair of substantially parallel flats includes polishing the cladding to reduce a thickness of the cladding in a direction substantially perpendicular to a long axis of the substantially rectangular cross section core.

* * * * *